United States Patent
Wu

(10) Patent No.: US 8,060,794 B2
(45) Date of Patent: Nov. 15, 2011

(54) NAND FLASH MEMORY AND METHOD FOR MANAGING DATA THEREOF

(75) Inventor: Kai-Ping Wu, Taipei Hsien (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 33 days.

(21) Appl. No.: 12/724,340

(22) Filed: Mar. 15, 2010

(65) Prior Publication Data

US 2011/0099435 A1      Apr. 28, 2011

(30) Foreign Application Priority Data

Oct. 22, 2009   (CN) .......................... 2009 1 0308647

(51) Int. Cl.
*G06F 11/00* (2006.01)

(52) U.S. Cl. ......... 714/54; 714/6.1; 714/6.12; 714/6.24; 714/6.3; 714/21

(58) Field of Classification Search .................. 714/6.1, 714/6.12, 6.24, 6.3, 21, 54; 713/1, 2
See application file for complete search history.

(56) References Cited

U.S. PATENT DOCUMENTS

| | | | |
|---|---|---|---|
| 7,594,135 B2* | 9/2009 | Gonzalez et al. ............... 714/6.1 |
| 2005/0160217 A1* | 7/2005 | Gonzalez et al. ................ 711/6 |
| 2009/0271603 A1* | 10/2009 | Wang ................................ 713/2 |
| 2010/0235617 A1* | 9/2010 | Chen ................................ 713/2 |
| 2010/0281297 A1* | 11/2010 | Jibbe et al. ........................ 714/6 |

* cited by examiner

*Primary Examiner* — Charles Ehne
(74) *Attorney, Agent, or Firm* — Altis Law Group, Inc.

(57) ABSTRACT

A NAND flash memory and method for managing data reads a header from each storage area, and identifies each storage area. Data of the primary storage area is updated if the primary storage area exists, and an operating system in the NAND flash memory is initiated according to the updated data in the primary storage area, or in the secondary storage area if the primary storage area does not exist but a secondary storage area does.

12 Claims, 6 Drawing Sheets

US 8,060,794 B2

NAND FLASH MEMORY AND METHOD FOR MANAGING DATA THEREOF

BACKGROUND

1. Technical Field

Embodiments of the present disclosure relate to data management, and more particularly to a NAND flash memory and a method for managing data thereof.

2. Description of Related Art

If any data in a block of a NAND flash memory requires updating, all data in the block is deleted before the updated data is written to the block. If data is deleted from the block of the NAND flash memory and no updated data is written, the operating system of the NAND flash memory may fail to initialize.

DETAILED DESCRIPTION

All of the processes described may be embodied in, and fully automated via, functional code modules executed by one or more general purpose computers or processors. The code modules may be stored in any type of computer-readable medium or other computer storage device. Some or all of the methods may alternatively be embodied in specialized computer hardware.

Figure 1:
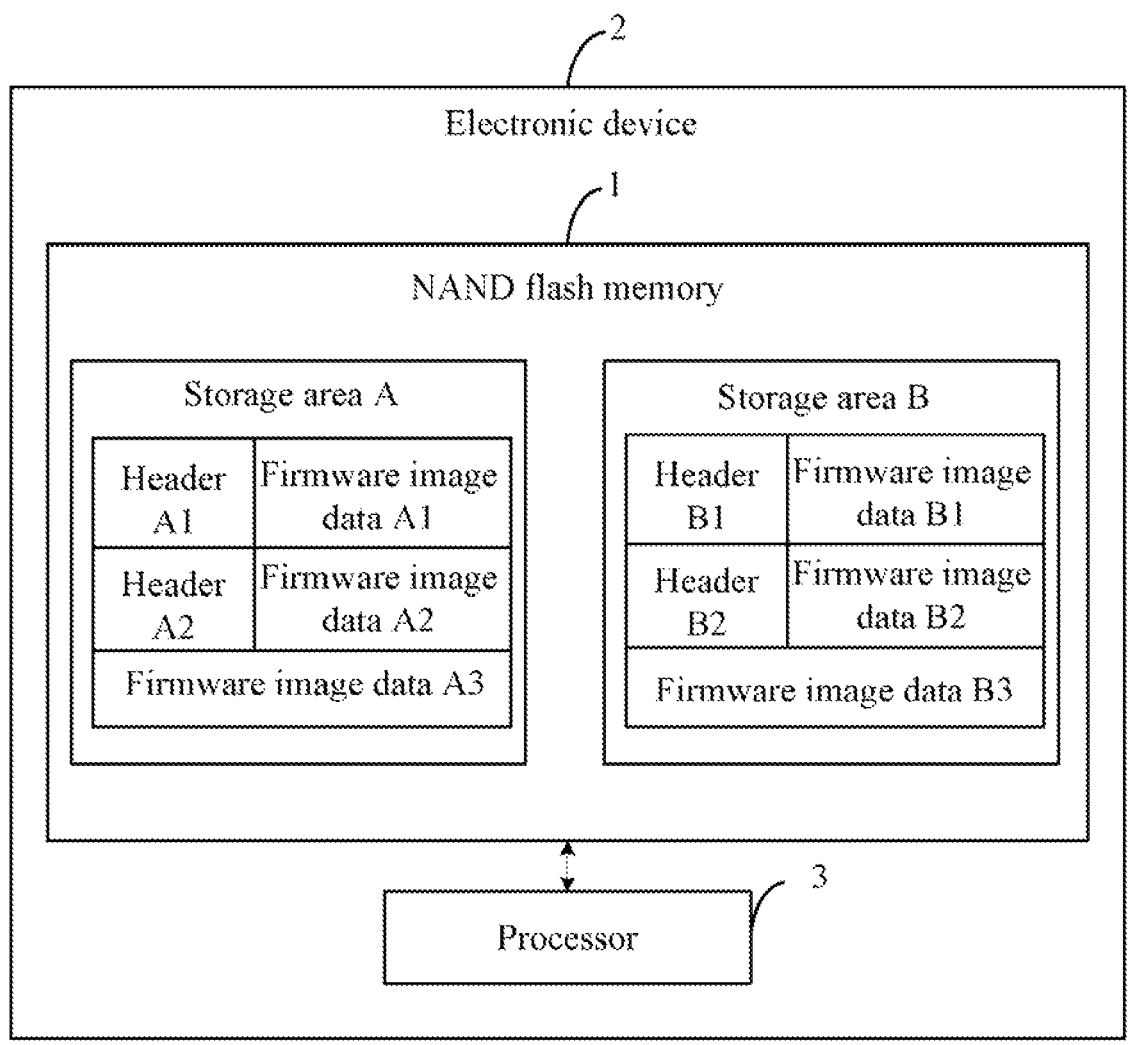
FIG. 1 is a block diagram of an electronic device including one embodiment of a NAND flash memory.

FIG. 1 is a block diagram of an electronic device 2 including one embodiment of a NAND flash memory 1 The NAND flash memory 1 stores various kinds of data, such as an operating system or applications, for example. The NAND flash memory 1 may include a plurality of storage areas, as shown in FIG. 1, there are two storage areas A and B in the NAND flash memory 1.

In one embodiment, the storage area A includes two blocks, each including a header, such as A1 and A2 as shown. The header A1 is stored in a block A1, and the header A2 is stored in a block A2. The headers A1 and A2 are in the same format. The block A1 further stores firmware image data A1, and the block A2 further stores firmware image data A2. In addition, the storage area A further stores firmware image data A3.

Similar to the storage area A, the storage area B also includes two blocks, including a header B1 and a header B2. The header B1 is stored in a block B1, and the header B2 is stored in a block B2. The headers B1 and B2 are in the same format. The block B1 further stores firmware image data B1, and the block B2 further stores firmware image data B2. In addition, the storage area B further stores firmware image data B3.

The electronic device 2 also includes a processor 3. The processor 3 executes one or more computerized operations of the NAND flash memory 1 and other applications, to provide functions of the NAND flash memory 1 and the electronic device 2.

Figure 2:
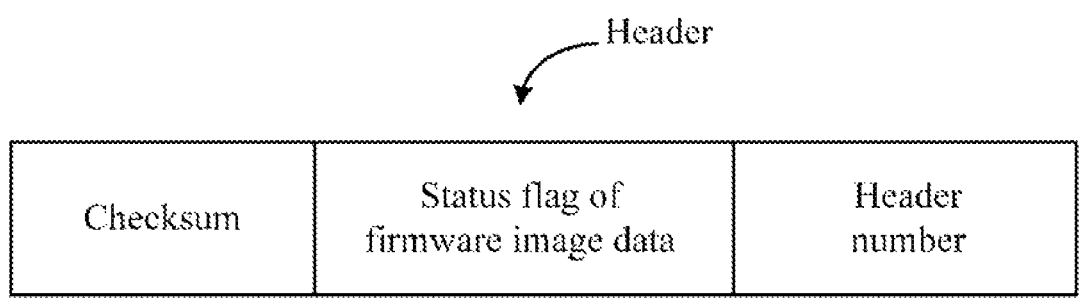
FIG. 2 is a schematic diagram illustrating a header of FIG. 1.

FIG. 2 is a schematic diagram illustrating a header of FIG. 1. In one embodiment, the header includes a checksum, a status flag of firmware image data, and a header number. The checksum determines whether the content of the header and the firmware image data in a block storing the header are correct. For example, if a header A1 includes a checksum A1, and the checksum A1 represents an incorrect checksum, the content of the header A1 and the firmware image data A1 are determined to be incorrect. Otherwise, if the checksum A1 represents a correct checksum, the content of the header A1 and the firmware image data A1 are determined to be correct. The status flag of image data identifies the firmware image data in a block storing the header. In one embodiment, identification of the firmware image data can comprise whether the firmware image data is primary firmware image data or secondary firmware image data. In one embodiment, the header number may be 1, 2, 3, and the data stored in a block have a lower header of a storage area new data.

Figure 3:
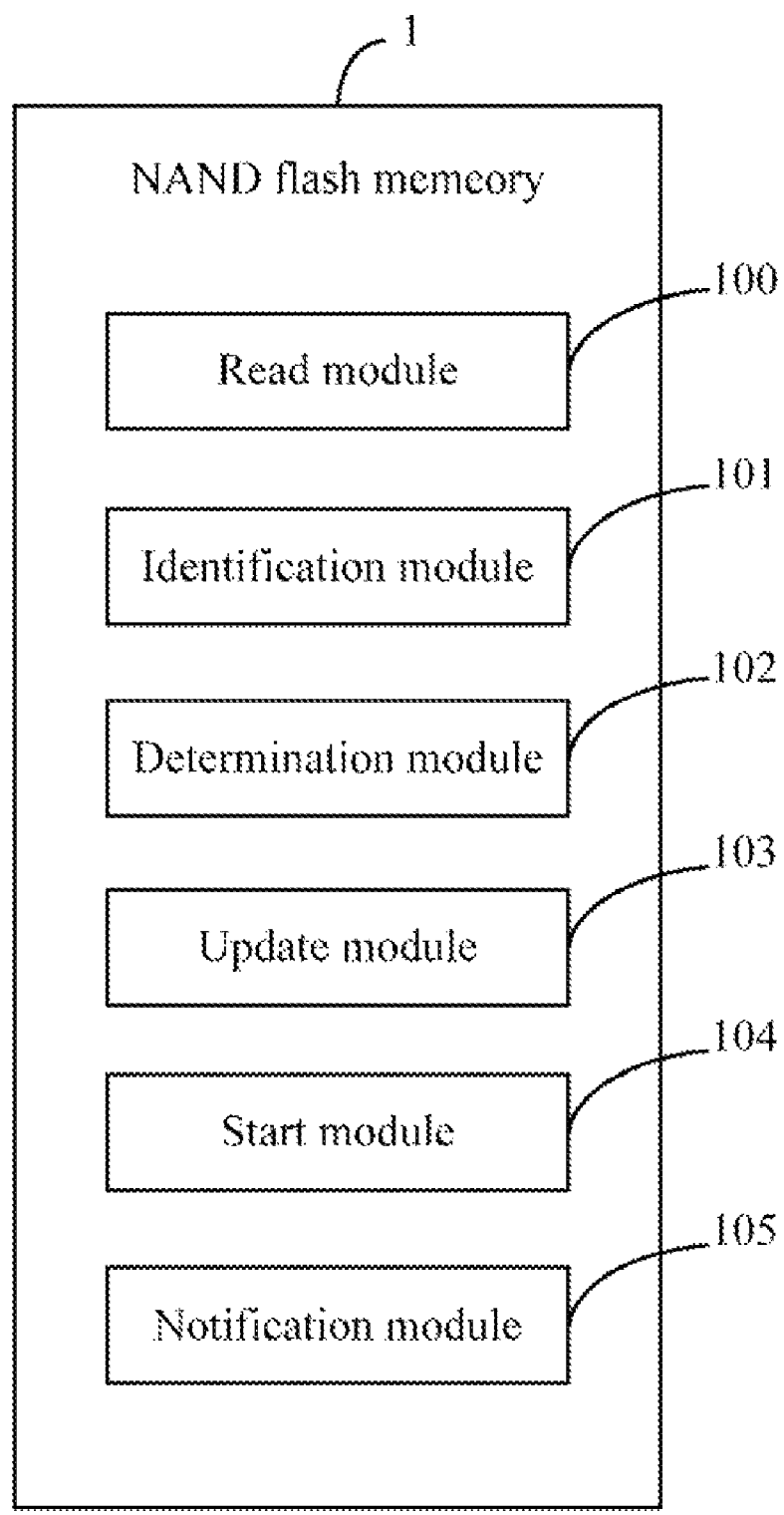
FIG. 3 is a block diagram of function modules of the NAND flash memory in FIG. 1.

FIG. 3 is a block diagram of function modules of the NAND flash memory in FIG. 1. In one embodiment, the NAND flash memory 1 includes a read module 100, an identification module 101, a determination module 102, an update module 103, a start module 104, and a notification module 105. The modules 100, 101, 102, 103, 104, and 105 may comprise one or more computerized codes to be executed by the processor 3 to perform one or more operations of the electronic device 1.

The read module 100 reads a header from each storage area of the NAND flash memory 1. In one embodiment, the read module 100 reads a header having a lower header number from each storage area if the checksum of each header in the storage area is correct, or reads a header having a correct checksum from each storage area if only one checksum of the two headers in the storage area is correct, or notifies that a storage area is invalid if neither checksum of each header in the storage area is correct.

The identification module 101 identifies each storage area according to a corresponding status flag of the firmware image data in the read header. Identification each storage area here determines whether the storage area is primary storage area or secondary storage area. In one embodiment, the identification module 101 identifies a storage area as primary storage area if the status flag of the firmware image data in the storage area indicates that the firmware image data is primary firmware image data. In another embodiment, the identification module 101 identifies the storage area as secondary storage area if the status flag of the firmware image data in the storage area indicates that the firmware image data is secondary firmware image data.

The determination module 102 determines whether the NAND flash memory 1 includes primary storage area. If a storage area of the NAND flash memory 1 is identified as a primary storage area, the determination module 102 determines the NAND flash memory 1 includes the primary storage area. If no storage area of the NAND flash memory 1 is identified as a primary storage area, the determination module 102 determines the NAND flash memory 1 does not include primary storage area.

The determination module 102 further determines whether data of the primary storage area need to be updated.

The update module 103 updates the data in the primary storage area if the data in the primary storage area requires updating. If two checksums of the primary storage area are correct, the update module 103 deletes data from a block having a higher header number, and reads a header number and firmware image data from a block having a lower header number. The update module 103 updates the read header number to a new header number, and calculates a new checksum according to an updated status flag of firmware image data, the new header number, and the read firmware image data. The update module 103 further writes the new header number, the new checksum, and the read firmware image data into the block from which the data has been deleted is amended correspondingly If only one checksum of the primary storage area is correct, the update module 103 deletes data from a block having an incorrect checksum, reads a header number and firmware image data from a block having a correct checksum, updates the read header number to a new header number, calculates a new checksum according to the updated status flag of the firmware image data, the new header number, and the read firmware image data, and writes the new header number, the new checksum, and the read firmware image data into the block from which the data has been deleted. If neither checksum of the primary storage area is correct, the update module 103 deletes data from a second block, reads a header number and firmware image data from a first block, updates the header number to a default header number, calculates a new checksum according to the updated status flag of the firmware image data, the new header number, and the read firmware image data, and writes the default header number, the new checksum, and the read firmware image data into the block from which the data has been deleted.

The start module 104 initiates an operating system in the NAND flash memory 1 according to the updated data in the primary storage area.

The determination module 102 also determines whether the NAND flash memory 1 includes a secondary storage area if the NAND flash memory 1 includes no primary storage area. If the status flag of the firmware image data in the storage area indicates that the firmware image data is secondary firmware image data, the determination module 102 determines that NAND flash memory 1 includes secondary storage. If the status flag of the firmware image data in the storage area indicates that the firmware image data is not secondary firmware image data, the determination module 102 determines that NAND flash memory 1 includes no secondary storage area.

The start module 104 further initializes the operating system in the NAND flash memory 1 according to data in the secondary storage area if the NAND flash memory 1 includes the secondary storage area and no primary storage area.

The notification module 105 provides notification that that the operating system in NAND flash memory 1 has failed to initiate if the NAND flash memory 1 includes no primary storage area and the secondary storage area.

Figure 4:
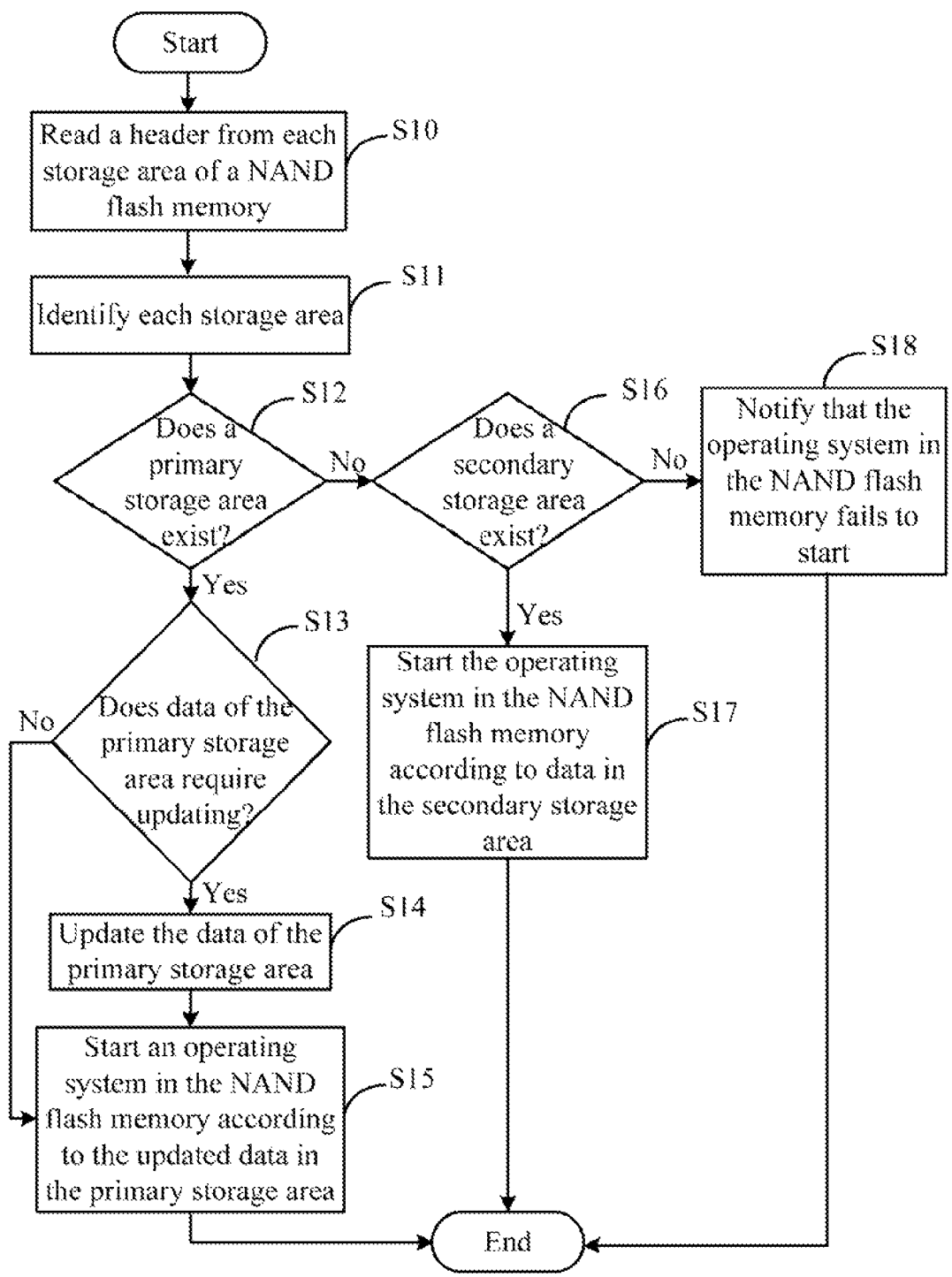
FIG. 4 is a flowchart of one embodiment of a method for managing data of a NAND flash memory, such as, for example, that of FIG. 1.

FIG. 4 is a flowchart of one embodiment of a method for managing data of a NAND flash memory 1. Depending on the embodiment, additional blocks may be added, others removed, and the ordering of the blocks may be replaced. Amend correspondingly In block S10, the read module 100 reads a header from each storage area of the NAND flash memory 1.

In block S11, the identification module 101 identifies each storage area according to a corresponding status flag of the firmware image data in the read header. Identification of each storage area determines whether the storage area is a primary storage area or a secondary storage area.

In block S12, the determination module 102 determines whether the NAND flash memory 1 includes the primary storage area.

If the NAND flash memory 1 includes the primary storage area, in block S13, the determination module 102 further determines whether data of the primary storage area requires updating.

In block S14, the update module 103 updates the data in the primary storage area if the data in the primary storage area requires updating.

In block S15, the start module 104 initiates an operating system in the NAND flash memory 1 according to the updated data in the primary storage area if the NAND flash memory 1 includes the primary storage area.

If the NAND flash memory 1 includes no primary storage area, in block S16, the determination module 102 also determines whether the NAND flash memory 1 includes the secondary storage area.

In block S17, the start module 104 further initiates the operating system in the NAND flash memory 1 if the NAND flash memory 1 includes the secondary storage area and no primary storage area.

In block S18, the notification module 105 provides notification that the operating system in NAND flash memory 1 has failed to initiate if the NAND flash memory 1 includes no primary storage area and the secondary storage area.

Figure 5:
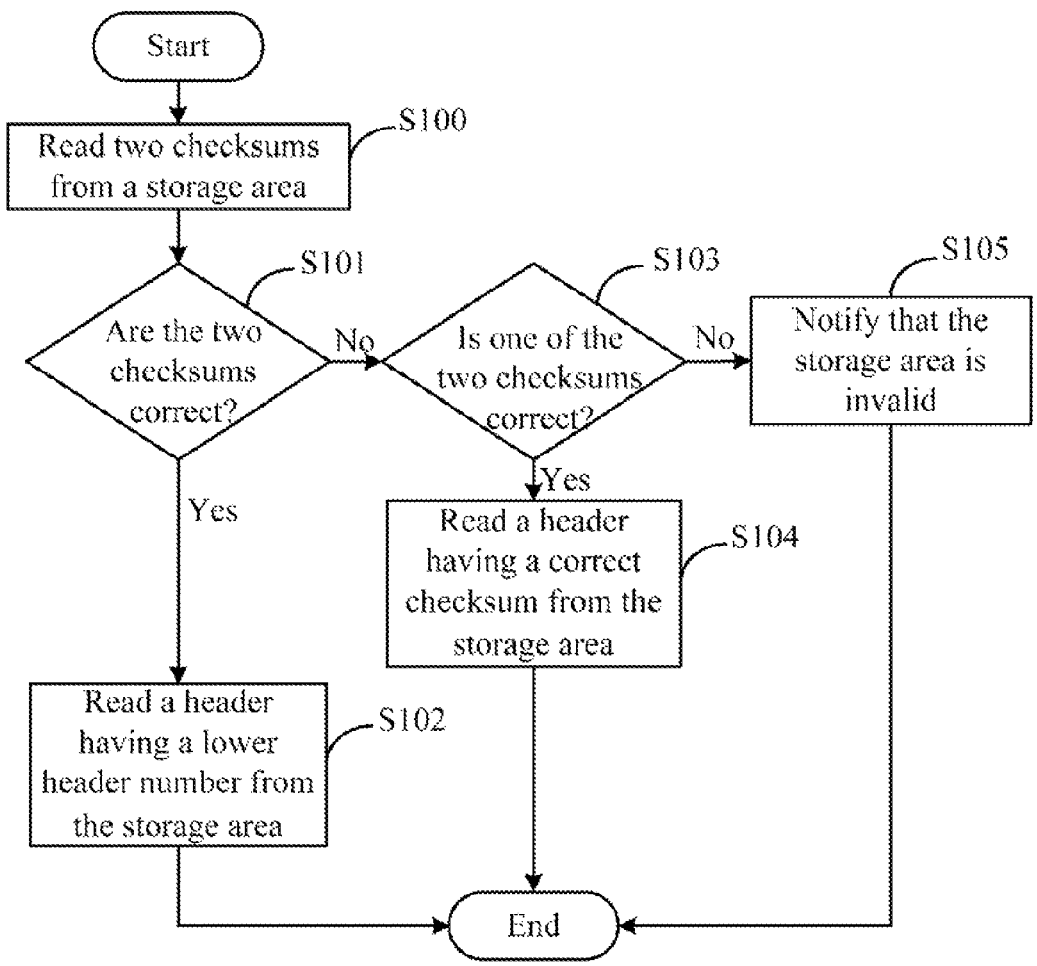
FIG. 5 is a flowchart of details of block S10 of FIG. 4.

FIG. 5 is a flowchart of details of block S10 of FIG. 4.

In block S100, the read module 100 read a header from a storage area. In block S101, the read module 100 determines whether two checksums of the storage are correct.

If the checksum of each header in the storage area is correct, in block S102, the read module 100 reads a header with a lower header number from each storage area.

If the checksum of each header in the storage area is not all correct, In block S103, the read module 100 determines whether one of the two checksums of the two headers in the storage area is correct. In block S104, the read module 100 reads a header having a correct checksum from a storage area if only one checksum of the two headers in the storage area is correct.

If neither checksum of each header in the storage area is correct, in block S105, the read module 100 provides notification that a storage area is invalid.

Figure 6:
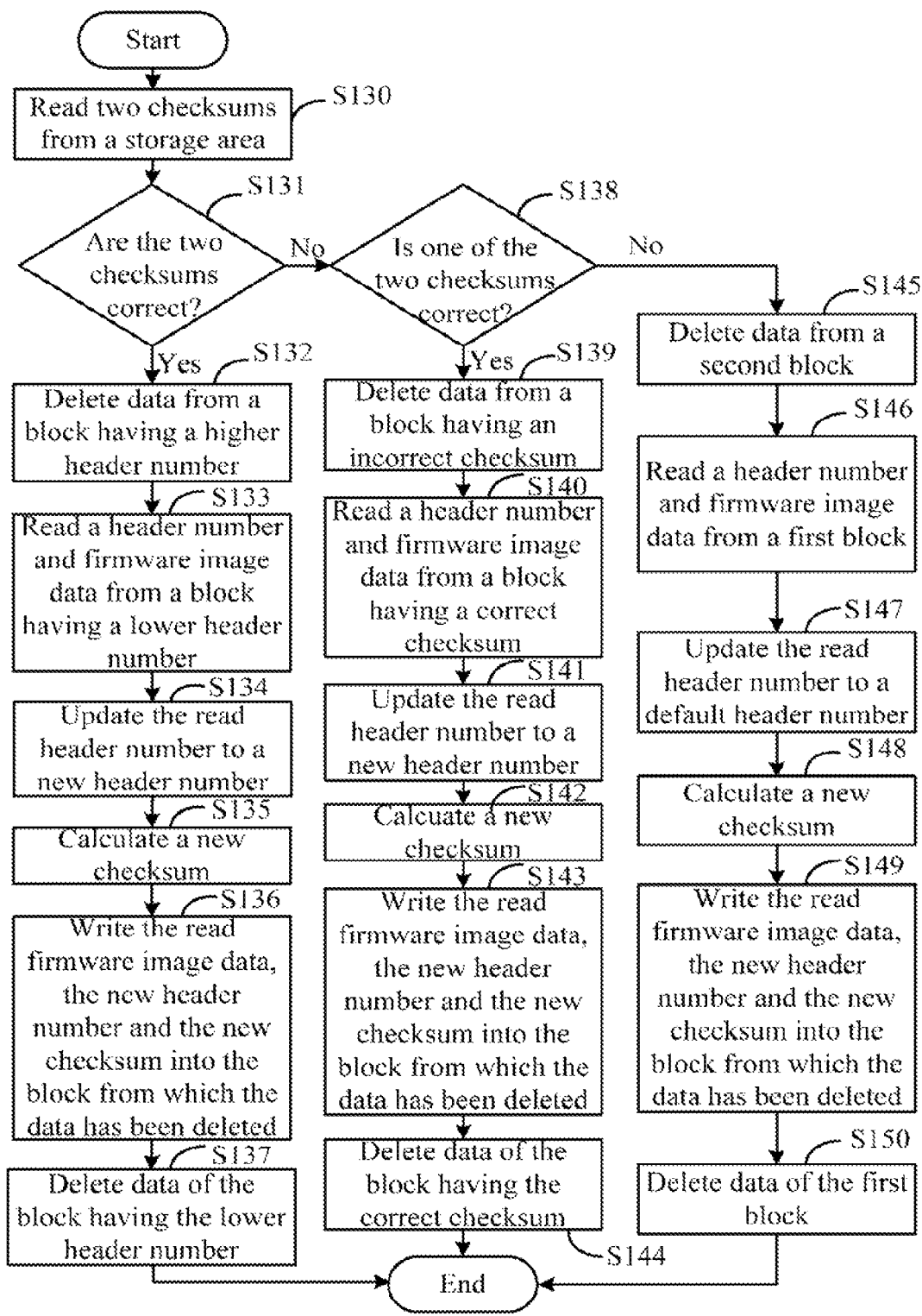
FIG. 6 is a flowchart of a method of updating a status flag of firmware image data of block S14 of FIG. 4.

FIG. 6 is a flowchart of one embodiment of updating a status flag of firmware image data of block S13 of FIG. 4.

In block S130, the update module 103 reads two checksums from a storage area of the NAND flash memory. In block S131, the update module 103 determines whether the two checksums are fully correct.

If the two checksums are fully correct, in block S132, the update module 103 deletes data from a block having a higher header number. In block S133, the update module 103 reads a header number and firmware image data from a block having a lower header number. In block S134, the update module 103 subtracts one from the read header number to get a new header number. In block S135, the update module 103 calculates a new checksum according to the updated status flag of the firmware image data, the new header number, and the read firmware image data. In block S136, the update module 103 writes the new header number, the new checksum, and the read firmware image data to the block from which the data has been deleted. In block S137, the update module 103 deletes data from the block having a lower header number.

If the two checksums are not fully correct, in block S138, the update module 103 determines whether one of the two checksums is correct. In block S139, the update module 103 deletes data from a block having an incorrect checksum. In block S140, the update module 103 reads a header number and firmware image data from a block having a correct checksum. In block S141, the update module 103 subtracts one from the read header number to get a new header number. In block S142, the update module 103 calculates a new checksum according to updated status flag of firmware image data, the new header number, and the read firmware image data. In block S143, the update module 103 writes the new header number, the new checksum, and the read firmware image data into the block from which the data has been deleted. In block S144, the update module 103 deletes data from the block having a correct header number.

If neither checksum is correct, in block S145, the update module 103 deletes data from a second block. In block S146, the update module 103 reads a header number and firmware image data from a first block. In block S147, the update module 103 updates the header number to a default header number. In block S148, the update module 103 calculates a new checksum according to updated status flag of firmware image data, the new header number, and the read firmware image data. In block S149, the update module 103 writes the default header number, the new checksum, and the read firmware image data into the block from which the data has been deleted. In block S144, the update module 103 deletes data from the first block.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. An electronic device comprising:
    a NAND flash memory comprising two storage areas, each of the storage areas comprising two blocks, each of the two blocks having a header and storing firmware image data, each header comprising a status flag of the firmware image data, a header number, and a checksum;
    at least one processor; and
    one or more programs stored in the NAND flash memory, executable by the at least one processor, the one or more programs comprising:
    a read module operable to read a lower header number from each of the storage areas if the checksum of each of the two headers in the storage area is correct, or read a header comprising a correct checksum from each of the storage areas if only one checksum of the two headers in the storage area is correct;
    an identification module operable to identify a storage area according to a status flag of the firmware image data in the read header, and determine if the NAND flash memory comprises a primary storage area or a secondary storage area according to identification of the storage area;
    a start module operable to initiate an operating system in the NAND flash memory according to data in the primary storage area if the NAND flash memory comprises the primary storage area, or initiate the operating system in the NAND flash memory according to data in the secondary storage area if the NAND flash memory comprises the secondary storage area and comprises no primary storage area;
    a notification module operable to provide notification that the operating system in the NAND flash memory has failed to initiate if the NAND flash memory does not comprise the primary storage area and the secondary storage area.

2. The electronic device according to claim 1, wherein the identification module identifies that the storage area is the primary storage area if the status flag of the firmware image data in the storage area indicates that the firmware image data is primary firmware image data; and identifies that the storage area is the secondary storage area if the status flag of the firmware image data in the storage area indicates that the firmware image data is secondary firmware image data.

3. The electronic device according to claim 2, wherein the one or more programs further comprise an update module operable to update data of the primary storage area if the NAND flash memory comprises the primary storage area.

4. The electronic device according to claim 3, wherein:
    if two checksums of the primary storage area are correct, the update module deletes data from a block comprising a higher header number, reads a header number and firmware image data from a block comprising a lower header number, the update module updates the read header number to a new header number, calculating a new checksum according to updated status flag of firmware image data, the new header number, and the read firmware image data, writes the new header number, the new checksum, and the read firmware image data into the block from which the data has been deleted;
    if only one checksum of the primary storage area is correct, the update module deletes data from a block comprising an incorrect checksum, reads a header number and firmware image data from a block comprising a correct checksum, updates the read header number to a new header number, calculates a new checksum according to updated status flag of firmware image data, the new header number, and the read firmware image data, writes the new header number, the new checksum, and the read firmware image data into the block from which the data has been deleted;
    if neither checksum of the primary storage area is correct, the update module deletes data from a second block, reads a header number and firmware image data from a first block, updates the header number to a default header number, calculates a new checksum according to updated status flag of firmware image data, the new header number, and the read firmware image data, writes the default header number, the new checksum, and the read firmware image data into the block from which the data has been deleted.

5. A method for updating data in a NAND flash memory, the NAND flash memory comprising two storage areas, each of the storage areas comprising two blocks, each of the two blocks comprising a header and storing firmware image data, each header comprising a status flag of the firmware image data, a header number, and a checksum, the method comprising:
    reading a lower header number from each of the storage areas if the checksum of each of the two headers in the storage area is correct, or reading a header comprising a correct checksum from each of the storage areas if only one checksum of the two headers in the storage area is correct;
    identifying a storage area according to a corresponding status flag of the firmware image data in the read header, and determining whether the NAND flash memory comprises a primary storage area or a secondary storage area according to identification the storage area; and
    if a primary storage area exists, initiating an operating system in the NAND flash memory according to the data in the primary storage area; or
    if no primary storage area exists but a secondary storage area exists, initiating the operating system in the NAND flash memory according to data in the secondary storage area; or if the NAND flash memory does not comprise the primary storage area and the secondary storage area, providing notification that the operating system in the NAND flash memory has failed to initiate.

6. The method according to claim 5, wherein the storage area is identified as the primary storage area if the status flag of the firmware image data in the storage area indicates that the firmware image data is primary firmware image data; and the storage area is identified as the secondary storage area if the status flag of the firmware image data in the storage area indicates that the firmware image data is secondary firmware image data.

7. The method according to claim 6, further comprising:
updating data of the primary storage area if the NAND flash memory comprises the primary storage area.

8. The method according to claim 7, further comprising:
deleting data from a block comprising a higher header number if the two checksums of the primary storage area are correct, reading a header number and firmware image data from a block comprising a lower header number, updating the read header number to a new header number, calculating a new checksum according to updated status flag of firmware image data, the new header number, and the read firmware image data, writing the new header number, the new checksum, and the read firmware image data into the block from which the data has been deleted;

deleting data from a block comprising an incorrect checksum if only one checksum of the primary storage area is correct, reading a header number and firmware image data from a block comprising a correct checksum, updating the read header number to a new header number, calculating a new checksum according to updated status flag of firmware image data, the new header number, and the read firmware image data, writing the new header number, the new checksum, and the read firmware image data into the block from which the data has been deleted;

deleting data from a second block if neither checksum of the primary storage area is correct, reading a header number and firmware image data from a first block, updating the header number to a default header number, calculating a new checksum according to updated status flag of firmware image data, the new header number, and the read firmware image data, writing the default header number, the new checksum, and the read firmware image data into the block from which the data has been deleted.

9. A NAND flash memory comprising stored thereon instructions that, when executed by a processor, cause the processor to perform a method for updating data in the NAND flash memory, the NAND flash memory comprising two storage areas, each of the storage areas comprising two blocks, each of the two blocks comprising a header and storing firmware image data, each header comprising a status flag of the firmware image data, a header number, and a checksum, the method comprising:
reading a lower header number from each of the storage areas if the checksum of each of the two headers in the storage area is correct, or reading a header comprising a correct checksum from each of the storage areas if only one checksum of the two headers in the storage area is correct;

identifying a storage area according to a corresponding status flag of the firmware image data in the read header, determining whether the NAND flash memory comprises a primary storage area or a secondary storage area according to identification the storage area; and if a primary storage area exists, initiating an operating system in the NAND flash memory according to the data in the primary storage area; or if a primary storage area does not exist but a secondary storage area exists, initiating the operating system in the NAND flash memory according to data in the secondary storage area; or if the NAND flash memory does not comprise the primary storage area and the secondary storage area, providing notification that that the operating system in the NAND flash memory has failed to initiate.

10. The NAND flash memory according to claim 9, wherein the storage area is identified as the primary storage area if the status flag of the firmware image data in the storage area indicates that the firmware image data is primary firmware image data; and the storage area is identified as the secondary storage area if the status flag of the firmware image data in the storage area indicates that the firmware image data is secondary firmware image data.

11. The NAND flash memory according to claim 10, further comprising updating data of the primary storage area if the NAND flash memory comprises the primary storage area.

12. The NAND flash memory according to claim 11, further comprising:
deleting data from a block comprising a higher header number if the two checksums of the primary storage area are correct, reading a header number and firmware image data from a block comprising a lower header number, updating the read header number to a new header number, calculating a new checksum according to updated status flag of firmware image data, the new header number, and the read firmware image data, writing the new header number, the new checksum, and the read firmware image data into the block from which the data has been deleted;

deleting data from a block comprising an incorrect checksum if only one checksum of the primary storage area is correct, reading a header number and firmware image data from a block comprising a correct checksum, updating the read header number to a new header number, calculating a new checksum according to updated status flag of firmware image data, the new header number, and the read firmware image data, writing the new header number, the new checksum, and the read firmware image data into the block from which the data has been deleted;

deleting data from a second block if neither checksum of the primary storage area is correct, reading a header number and firmware image data from a first block, updating the header number to a default header number, calculating a new checksum according to updated status flag of firmware image data, the new header number, and the read firmware image data, writing the default header number, the new checksum, and the read firmware image data to the block from which the data has been deleted.

* * * * *